(12) United States Patent
Gilchrist et al.

(10) Patent No.: US 9,140,763 B2
(45) Date of Patent: Sep. 22, 2015

(54) WIRELESS POWER TRANSFER TEST SYSTEM

(71) Applicants: Aaron Gilchrist, Nibley, UT (US);
Hunter Wu, Salt Lake City, UT (US);
Kylee D. Sealy, Providence, UT (US);
Paul D. Israelsen, Logan, UT (US)

(72) Inventors: Aaron Gilchrist, Nibley, UT (US);
Hunter Wu, Salt Lake City, UT (US);
Kylee D. Sealy, Providence, UT (US);
Paul D. Israelsen, Logan, UT (US)

(73) Assignee: Utah State University, N. Logan, UT (US)

( * ) Notice: Subject to any disclaimer, the term of this patent is extended or adjusted under 35 U.S.C. 154(b) by 113 days.

(21) Appl. No.: 13/622,895

(22) Filed: Sep. 19, 2012

(65) Prior Publication Data

US 2013/0069625 A1    Mar. 21, 2013

Related U.S. Application Data

(60) Provisional application No. 61/536,145, filed on Sep. 19, 2011.

(51) Int. Cl.
*G01R 19/00* (2006.01)
*G01R 31/40* (2014.01)
*B60L 11/18* (2006.01)

(52) U.S. Cl.
CPC ............... *G01R 31/40* (2013.01); *B60L 11/182* (2013.01); *G01R 19/0092* (2013.01); *Y02T 10/7005* (2013.01); *Y02T 90/122* (2013.01); *Y02T 90/14* (2013.01)

(58) Field of Classification Search
CPC . G01R 19/0092; G01R 1/203; G01R 31/2642
USPC .......... 324/76.11, 72, 73, 315, 340, 356, 362, 324/370, 374, 375, 379, 455, 714, 378, 403, 324/409, 410, 411, 678, 76.32, 76.34, 324/76.65, 76.66, 76.67, 76.68, 87, 89
See application file for complete search history.

(56) References Cited

U.S. PATENT DOCUMENTS

| 4,227,182 | A | * | 10/1980 | Ogasawara et al. ....... 340/870.37 |
| 4,661,897 | A | | 4/1987 | Pitel et al. |
| 5,055,779 | A | * | 10/1991 | Kerschner et al. ........ 324/757.02 |
| 5,268,087 | A | * | 12/1993 | Lu ................................. 204/434 |
| 5,521,444 | A | * | 5/1996 | Foreman ........................ 307/104 |
| 5,737,154 | A | * | 4/1998 | Kumagai et al. .............. 360/272 |
| 5,785,826 | A | * | 7/1998 | Greenspan .................... 204/212 |
| 6,317,338 | B1 | | 11/2001 | Boys |

(Continued)

FOREIGN PATENT DOCUMENTS

| EP | 1717940 A2 | 2/2006 |
| FR | 2738417 A1 | 3/1997 |

(Continued)

OTHER PUBLICATIONS

Brooker et al., Technology improvement pathways to cost effective vehicle electrification, 2010 SAE2010 World Cong. 1-18 (Feb. 1, 2010).

(Continued)

*Primary Examiner* — Arleen M Vazquez
*Assistant Examiner* — Dominic Hawkins
(74) *Attorney, Agent, or Firm* — Kunzler Law Group

(57) ABSTRACT

A testing system for wireless power transfer systems, including a stationary plate, a rotating plate, and a driver to rotate the rotating plate with respect to the stationary plate.

18 Claims, 3 Drawing Sheets

(56) References Cited

U.S. PATENT DOCUMENTS

| | | | |
|---|---|---|---|
| 6,366,051 B1 | 4/2002 | Nantz et al. | |
| 6,448,745 B1 | 9/2002 | Killat et al. | |
| 6,500,316 B1* | 12/2002 | Fatula et al. | 204/212 |
| 7,148,669 B2 | 12/2006 | Maksimovic et al. | |
| 7,425,097 B1* | 9/2008 | Chappell et al. | 384/109 |
| 7,652,459 B2 | 1/2010 | Qahouq et al. | |
| 8,085,024 B2 | 12/2011 | Prodic et al. | |
| 8,684,685 B2* | 4/2014 | Delvaux | 415/195 |
| 2005/0172750 A1* | 8/2005 | Kock et al. | 74/490.01 |
| 2006/0003604 A1* | 1/2006 | Angerpointner | 439/13 |
| 2006/0181906 A1 | 8/2006 | Batarseh et al. | |
| 2008/0203992 A1 | 8/2008 | Qahouq et al. | |
| 2009/0174263 A1 | 7/2009 | Baarman et al. | |
| 2009/0267582 A1 | 10/2009 | Prodic et al. | |
| 2010/0109604 A1 | 5/2010 | Boys et al. | |
| 2011/0049978 A1 | 3/2011 | Sasaki et al. | |
| 2011/0163542 A1 | 7/2011 | Farkas | |
| 2011/0181240 A1 | 7/2011 | Baarman et al. | |
| 2011/0304216 A1 | 12/2011 | Baarman | |
| 2012/0049620 A1 | 3/2012 | Jansen | |
| 2012/0146576 A1* | 6/2012 | Partovi | 320/108 |
| 2013/0049484 A1 | 2/2013 | Weissentern et al. | |

FOREIGN PATENT DOCUMENTS

| | | |
|---|---|---|
| RU | 2412514 C2 | 2/2011 |
| TW | 200810315 A | 2/2008 |
| WO | 2012001291 A2 | 1/2012 |
| WO | 2012007942 A2 | 1/2012 |

OTHER PUBLICATIONS

Budhia et al., Design and Optimisation of Circular Magnetic Structures for Lumped Inductive Power Transfer Systems, 2009 Energy Conversion Cong. and Expo 2081-2088 (Sep. 20-24, 2009).

Magnus et al., A d.c. magnetic metamaterial, 7:4 Nat. Mater. 295-297 (2008).

Milton et al., Realizability of metamaterials with prescribed electric permittivity and magnetic permeability tensors, 12 New Journal of Physics (Mar. 2010).

Zierhofer et al., Geometric approach for coupling enhancement of magnetically coupled coils, 43 IEEE Transactions on Biomedical Engineering 708-714 (1996).

Boys et al., Stability and control for inductively coupled power transfer systems, 147 IEE Proc.—Electric Power Applications 37-43 (2000).

Wu et al., A 1kW inductive charging system using AC processing pickups, 6 IEEE Industrial Electronics and Applications 1999-2004 (Jun. 21-23, 2011).

Covic et al., A Three-Phase Inductive Power Transfer System for Roadway-Powered Vehicles, 54:6 IEEE Transactions on Industrial Applications 3370-3378 (2007).

Borage et al., Analysis and design of an LCL-T resonant converter as a constant-current power supply, 52 IEEE Transactions on Industrial Electronics 1547-1554 (2005).

Wu et al., Design of Symmetric Voltage Cancellation Control for LCL converters in Inductive Power Transfer Systems, 2011 IEEE International Electric Machines & Drives Conf. 866-871 (May 15-18, 2011).

Nakao et al., Ferrite core couplers for inductive chargers, 2 Power Conversion Conf. 850-854 (2002).

Wu et al., A review on inductive charging for electric vehicles, 2011 IEEE Int'l Macnines & Drives Conf. 143-147 (May 15-18, 2011).

Huang et al., LCL pick-up circulating current controller for inductive power transfer systems, 2010 IEEE Energy Conversion Cong. and Exposition (ECCE) 640-646 (Sep. 12-16, 2010).

Budhia et al., A new IPT magnetic coupler for electric vehicle charging systems 36 IEEE Industrial Electronics and Applications 2487-2492 (Nov. 7-10, 2010).

Budhia et al., Development and evaluation of single sided flux couplers for contactless electric vehicle charging, 2011 IEEE Energy Conversion Cong. and Expo 613-621 (Sep. 17-22, 2011).

Chigira et al., Small-Size Light-Weight Transformer with New Core Structure for Contactless Electric Vehicle Power Transfer System, 2011 IEEE Energy Conversion Cong. and Expo 260-266 (Sep. 17-22, 2011).

Jin et al., Characterization of novel Inductive Power Transfer Systems for On-Line Electric Vehicles, 26 IEEE Applied Power Electronics Conference and Expo 1975-1979 (Mar. 6-11, 2011).

Nagatsuka et al., Compact contactless power transfer system for electric vehicles, 2010 Int'l Power Electronics Conf. 807-813 (Jun. 21-24, 2010).

Covic et al., Self tuning pick-ups for inductive power transfer, 2008 IEEE Power Electronics Specialists Conf. 3489-3494.

Si et al., Wireless Power Supply for Implantable Biomedical Device Based on Primary Input Voltage Regulation, 2 IEEE Cof. on Industrial Electronics and Applications 235-239 (2007).

Joung et al., An energy transmission system for an artificial heart using leakage inductance compensation of transcutaneous transformer, 13 IEEE Transactions on Power Electronics 1013-1022 (1998).

Si et al., A Frequency Control Method for Regulating Wireless Power to Implantable Devices, 2 IEEE Transactions on Biomedical Circuits and Systems 22-29 (2008).

Sasaki et al., Thermal and Structural Simulation Techniques for Estimating Fatigue of an IGBT Module, 20 Power Semiconductor Devices and IC's 181-184 (2008).

Ciappa et al., Lifetime prediction of IGBT modules for traction applications, 38 IEEE Reliability Physics Symp. 210-216 (2000).

Borage et al., Analysis and design of an LCL-T resonant converter as a constant-current power supply, 52 IEEE Int'l Electric Machines & Drives Conf. 1547-1554 (2005).

Budhia et al., A new IPT magnetic coupler for electric vehicle charging systems, 36 IEEE Industrial Electronics Conf. 2487-2492 (Nov. 10-17, 2010).

Keeling et al., A Unity-Power-Factor IPT Pickup for High-Power Applications, 57 IEEE Transactions on Industrial Electronics 744-751 (Feb. 2010).

Boys et al., Single-phase unity power-factor inductive power transfer system, 2008 IEEE Power Electronics Specialists Conf. 3701-3706.

Xu et al., Modeling and controller design of ICPT pickups, 3 Int'l Conf. on Power System Technology 1602-1606 (2002).

Si et al., Analyses of DC Inductance Used in ICPT Power Pick-Ups for Maximum Power Transfer, 2005 IEEE Transmission and Distribution Conf. and Exhibition: Asia and Pacific 1-6 (2005).

Boys et al., Controlling inrush currents in inductively coupled power systems, 7 IEEE Int'l Power Engineering Conference 1046-1051 (2005).

Musavi et al., A High-Performance Single-Phase Bridgeless Interleaved PFC Converter for Plug-in Hybrid Electric Vehicle Battery Chargers, 47 IEEE Transactions on Industry Applications 1833-1843 (Jul.-Aug. 2011).

Elliott et al., Multiphase Pickups for Large Lateral Tolerance Contactless Power-Transfer Systems, 57 IEEE Transactions on Industrial Electronics 1590-1598 (May 2010).

Wang et al., Design considerations for a contactless electric vehicle batter charger, 52 IEEE Transactions on Industrial Electronics 1308-1314 (2005).

* cited by examiner

WIRELESS POWER TRANSFER TEST SYSTEM

CROSS-REFERENCE TO RELATED APPLICATIONS

This application claims priority to U.S. Provisional Application No. 61/536,145, entitled "Wireless Power Transfer Test System," filed on Sep. 19, 2011, the entirety of which is incorporated herein by reference.

GOVERNMENT SPONSORED RESEARCH

This invention was made with government support under contract DE-EE0003114/000 awarded by the Department of Energy. The government has certain rights in the invention.

TECHNICAL FIELD

The present disclosure relates to in-motion wireless power transfer, sometimes referred to as "dynamic charging", "on the go charging", or "online electric vehicles." Specifically, the disclosure relates to test systems and methods designed for testing in-motion wireless power transfer systems.

BACKGROUND

Wireless power transfer (WPT), also known as inductive power transfer (IPT), is the transmission of electrical energy from a power source to an electrical load without interconnecting wires. The principle of WPT is well known, yet the practical application has yet to be applied in broad-based electric transportation applications.

One application of WPT is the use of WPT to charge vehicles. WPT and its use in vehicular applications have both been described in numerous publications. See, e.g., H. H. Wu, G. A. Covic, J. T. Boys and A. P. Hu, "A 1 kW inductive charging system using AC processing pickups," in Industrial Electronics and Applications (ICIEA), 2011 6th IEEE Conference on, 2011, pp. 1999-2004; M. Budhia, G. Covic and J. Boys, "Design and Optimisation of Circular Magnetic Structures for Lumped Inductive Power Transfer Systems," IEEE Transactions on Power Electronics, vol. PP, no. 99, pp. 1-1, 2011; and G. A. Covic, J. T. Boys, M. L. G. Kissin and H. G. Lu, "A Three-Phase Inductive Power Transfer System for Roadway-Powered Vehicles," IEEE Transactions on Industrial Electronics, vol. 54, no. 6, pp. 3370 -3378, December 2007, 2007.

Although WPT has been described to some degree in transferring electrical power to stationary receivers, in-motion WPT for high-speed and high efficiency applications has yet to be developed to a point of practical application, particularly in vehicles. A system for in-motion WPT conventionally includes power transmission hardware (typically fixed in location) and power receiving hardware on board a vehicle moving relative to the transmission hardware. However, systems and associated methods for testing such components are needed to advance the technology further.

SUMMARY

The present disclosure in aspects and embodiments addresses these various needs and problems by providing test systems and associated methods that employ a rotating test bed in which no vehicle is necessary. The test system includes a driver, a rotating plate, and a stationary plate. Receivers and transmitters to be tested may be mounted to the plates and then driven in a circular path that closely approximates the conditions expected in real word conditions and applications. The relative velocity between transmitters and receivers is variable and can match or exceed a 75 mph (or system speed) target.

Advantages include, but are not limited to, cost-effective set up; the ability to control climate and weather conditions; the ability to control and adjust the space between transmitters and receivers; the capacity to control and variably adjust the relative speed of the transmitter/receiver with respect to a corresponding transmitter/receiver; the reduced need for numerous prototype transmitters and/or receivers; and the ability to easily interchange transmitters, receivers, and other components without the need to install them in a roadway or vehicle. In addition, the test systems described herein are easily instrumented and monitored, which may not be the case for outdoor test tracks. Finally the systems described have excellent flexibility and adaptability to test a range of WPT hardware over a range of in-motion roadway-like conditions.

DETAILED DESCRIPTION

Figure 1:
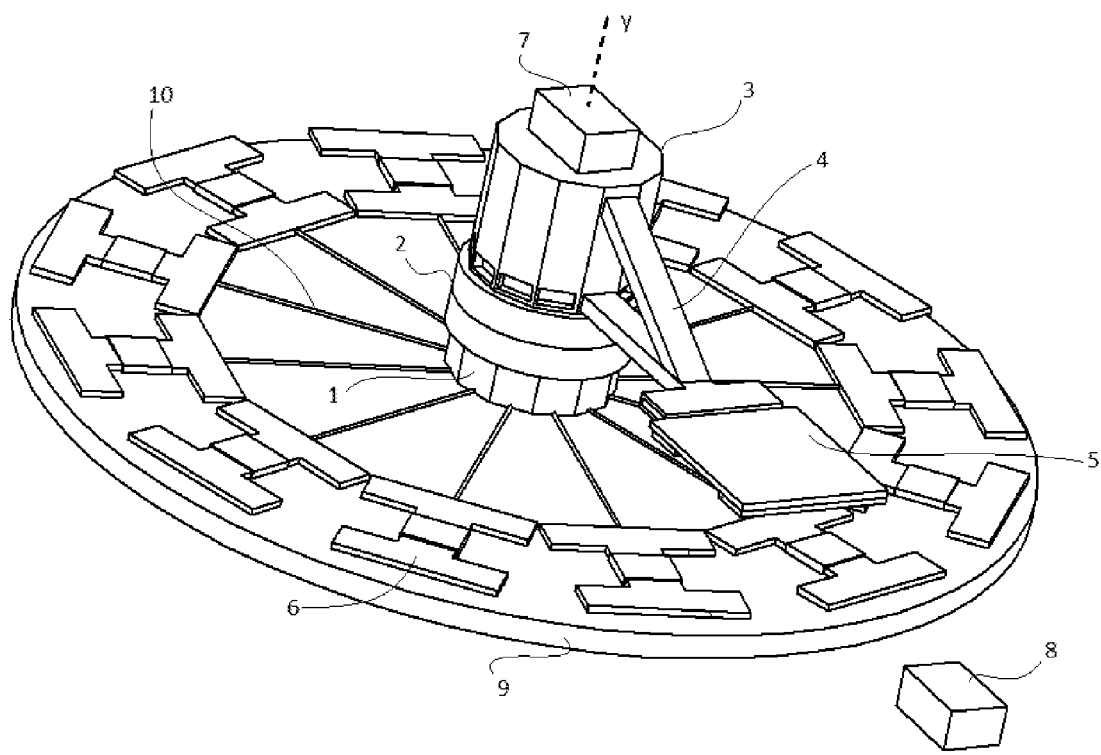
FIG. 1 illustrates an exemplary testing system.

The present disclosure covers systems, apparatuses, and associated methods for testing WPT systems. Those skilled in the art will recognize that embodiments can be practiced with or without one or more of the specific details, or with or without other methods, components, materials, etc. Furthermore, the described features, structures, or characteristics may be combined in any suitable manner in a variety of alternative embodiments. Thus, the following description with reference to the figures is not intended to limit the scope of the invention, but is merely representative of various embodiments.

In this specification and the claims that follow, singular forms such as "a," "an," and "the" include plural forms unless the content clearly dictates otherwise. All ranges disclosed herein include, unless specifically indicated, all endpoints and intermediate values. In addition, "optional" or "optionally" refer, for example, to instances in which subsequently described circumstance may or may not occur, and include instances in which the circumstance occurs and instances in which the circumstance does not occur. The terms "one or more" and "at least one" refer, for example, to instances in which one of the subsequently described circumstances occurs, and to instances in which more than one of the subsequently described circumstances occurs.

In future in-motion systems, the transmitters might be embedded in a roadway and the receivers mounted to a vehicle. Unfortunately, it is a substantial challenge to accomplish significant power transfer while the vehicle is moving at speeds up to 75 miles per hour. To further add to this challenge is the absence of affordable, customizable testing systems where the WPT system may be designed and optimized.

To meaningfully test WPT systems, enough time at the pseudo steady condition proposed for the transfer must be included such that the data will be consistent and relevant. One choice for the test bed then would be to embed many transmitters in a test road, or to track and outfit an actual vehicle with receiver(s) and drive it at a high speed. Such as system is costly, time consuming to set up, and most likely implies testing in an outdoor arena, where weather is sometimes prohibitive.

In embodiments, the testing system may include at least one stationary plate, at least one rotating plate, and at least one driver. The plates are configured so that a WPT transmitter and receiver may be mounted thereto. When the system is testing WPT systems, at least one transmitter and at least one receiver is employed. Thus, in testing, the driver, stationary plate, and rotating plate with transmitter and receiver may be configured, for example, in one of the following three configurations: (1) a stationary transmitter and a rotating receiver driven by the driver, (2) a stationary receiver and a rotating transmitter driven by the driver, and (3) a rotating transmitter driven by a first driver and a rotating receiver driven by a second driver in a direction opposite to that of the transmitter. Thus, the testing system is configured so that the transmitter and receiver are intermittently, rotationally positioned close enough to each other to transfer power wirelessly.

Figure 2:
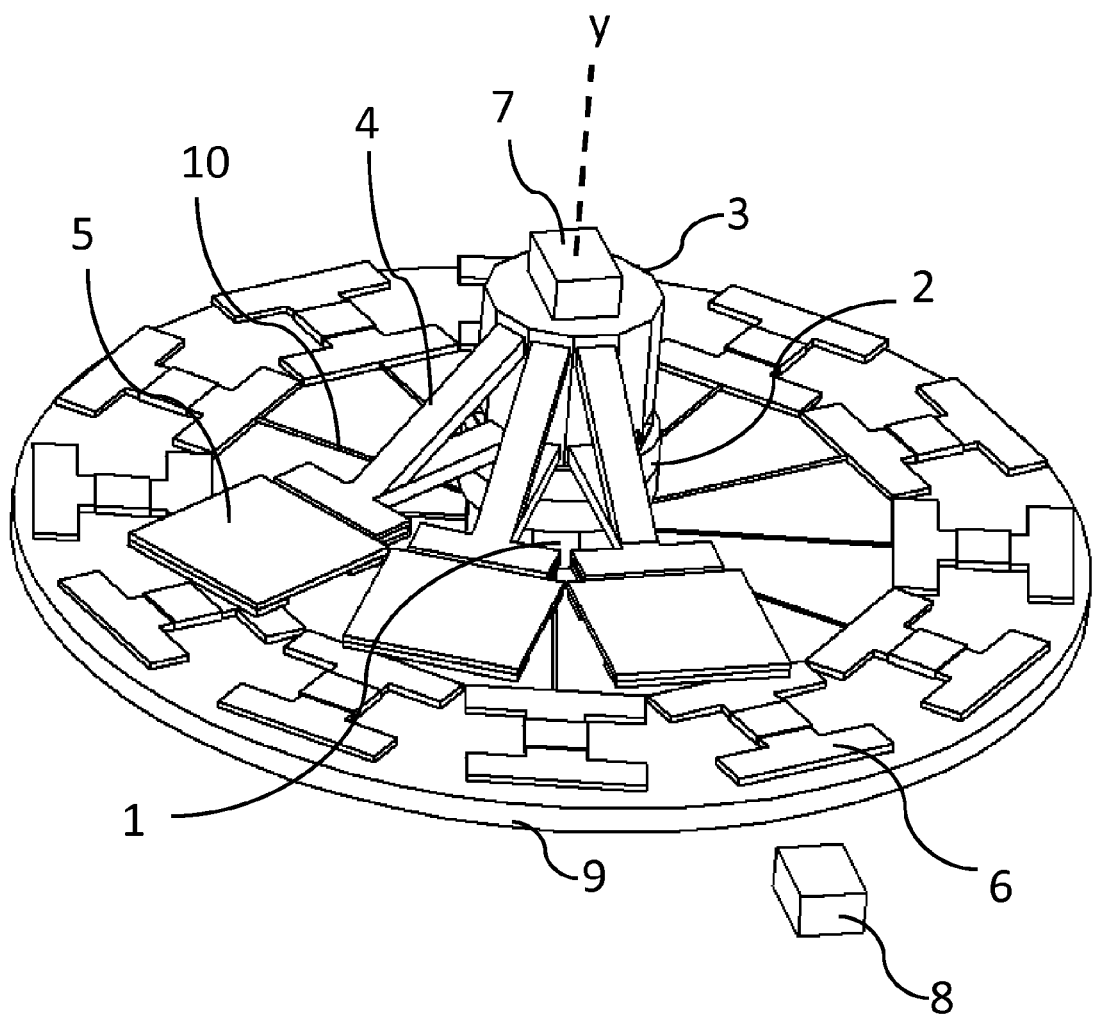
FIG. 2 illustrates an exemplary testing system.

FIG. 1 illustrates an exemplary testing system. In FIG. 1, the lower housing assembly 1 includes a driver, such as an electric motor and gearbox. The lower housing assembly 1 is separated from the upper housing assembly 3 by a slip ring assembly 2, which optionally supplies power or data, or both. In some embodiments, a slip ring assembly may be omitted by using the wireless power transferred across the transmitter and receiver to power the upper assembly. In this case, data may be transmitted wirelessly as well. The upper housing assembly 3 may include, for example, bearing(s), tachometer, and motor speed control components. To the upper housing assembly 3, is attached at least one support arm 4, which supports a rotating plate 5 for either a transmitter or receiver. The support arm 4 is configured to rotate in a circular pattern around an axis y that goes through the center of the lower housing assembly 1, upper housing assembly 3, and slip ring assembly 2. In some embodiments multiple support arms may be employed to simulate desired testing conditions. For example, any number of support arms, such as from 1-12 (1, 2, 3, 4, 5, 6, 7, 8, 9, 10, 11, 12) or more, could be employed. See, e.g. FIG. 2 (FIG. 2 has identical components to those illustrated in FIG. 1 except that it employs a multiple-arm and multiple-rotating pad system).

When operated, the rotating plate 5 passes over a stationary plate 6, or one or more stationary plates 6, where a transmitter or receiver may be attached. In FIG. 1, 12 stationary plates are illustrated. However, the number of plates may be adjusted to provide various and desired in-motion simulation conditions. Thus, the number of plates could include from 1-12 (1, 2, 3, 4, 5, 6, 7, 8, 9, 10, 11, 12) or more stationary plates. The plates are placed in a circular arrangement and a simple scaling factor can be applied to simulate the condition of traveling on a straight road. This solution is much less expensive than, for example, building a one-mile test track or linear test facility.

In FIG. 1, rotating side electronics control and monitoring hardware 7 and stationary side electronics control and monitoring hardware 8 are provided. Hardware 7 and 8 contain the power conversion electronics necessary for WPT systems. In addition, they can be configured to house monitoring electronics that have a purpose of obtaining data on the unit under test and on the test system such as currents, voltages, angular position, speed, acceleration, and temperatures. The electronics hardware may be connected so that it can supply and receive data from a central data station, such as one or more computers.

The entire system may be supported on a base support structure 9, which is designed to provide a steady, fixed base for the rotating components. From the lower housing assembly 1, a wire interconnect assembly 10 is optionally connected to the stationary plate(s) 6. If multiple stationary plates 6 are used, then multiple wire interconnect assemblies 10 are employed. The wire interconnect assemblies 10 may be used to transfer power to or from transmitter or receiver pads mounted to the stationary plate(s) 6.

In some embodiments, the testing system may be configured so that the support arm 4 and rotating plate 5 are stationary and the stationary plate(s) 6 rotates, or configured such that both sets of plates rotate with a target relative angular velocity between them.

The rotating plate 5 and stationary plate 6 may be adjustably separated via a mechanism such as (for example) linear and angular positioner stages. The stages allow the alignment, angle, and distance between the pads to be varied. This way, various testing conditions may be simulated (for example lane changes might be simulated) and different WPT transmitter and receiver pads of varying thicknesses may be tested. When WPT receiver and transmission pads are mounted to the rotating plate 5 and stationary plate 6, the distance between the pads may be any practicable distance. To date, distances for in-motion charging systems may be envisioned in the 6-22 inch range. Further, the angle between the plates may be adjustable and the length and angle of all arms can be adjusted. This allows simulation of a wide range of possible roadway conditions for the design of in-motion WPT systems.

Rotation of the plates may occur at any suitable speed to create the desired simulation conditions. For example, rotation can be variable or constant within a single test session. Suitable rotations per minute (rpm) may include from 0-300 rpm, from 50-200 rpm, or from 75 rpm to 150 rpm. In embodiments exemplified here, 0-150 rpm simulates 0-75 mph.

In many indoor applications, the motion can be driven by typical industrial electric motors (with gearbox) in the 10 to 50 horsepower range. Control of rotation speed, position, and angular acceleration may be accomplished by a number of practical means such as variable frequency A/C drives, position encoders, tachometers, and resistor/thyristor controls. Test data regarding the unit under test and monitoring of the test system can be passed to a data-monitoring center, such as a set of computers, via multiple paths. One path is by wired communication protocol with the data cable passing as necessary through the slip ring(s). Another path is by wireless telecommunication protocol. The entire rotating test assembly is anticipated as surrounded by safety walls; therefore optical observation, webcams, and other remote monitoring means are proposed.

The sizes of the structural members may be adjusted substantially depending on the simulation conditions desired and on the type and size of transmitters and receivers to be tested. For example, larger transmitters/receivers may require larger testing systems. In some embodiments, the dimensions of the system are accommodated indoors easily within the space constraints of many laboratory facilities. In other embodiments, the dimensions are larger for outdoor or warehouse facilities.

The above-described components may be made of any material suitable for the desired purpose of the specific component. In many cases, typical engineering metals will be employed. Structural and strength considerations may contribute to the selection of specific materials. For example, the components may be made of metal, metal alloys, steel, aluminum, plastics, composites, wood, insulating materials, rubber, elastomeric materials, etc. Composite and non-metal materials will be substituted in many cases to ensure the test bed materials do not affect the magnetic fields being generated with the wireless power transfer system.

Pad masses from 2 to 75 kg, such as from 4.5 to 50 kg, may be supported by the structure. Pad diameters or diagonal dimensions of from 0.4 m to 2.0 m may be supported. In some embodiments, the arms are configured for full functionality at the maximum anticipated pad mass. However, specifically tailored test systems may also be implemented for specific transmitters/receivers or desired component parameters. To adjust for pad dimension for the embodiments exemplified in FIGS. 1 and 2, use of an adjustable arm length may be employed. Alternatively, a series of interchangeable arms of varying lengths and/or weight tolerances may be used. In such cases, an arm appropriate to the pad under test is selected and applied.

Figure 3:
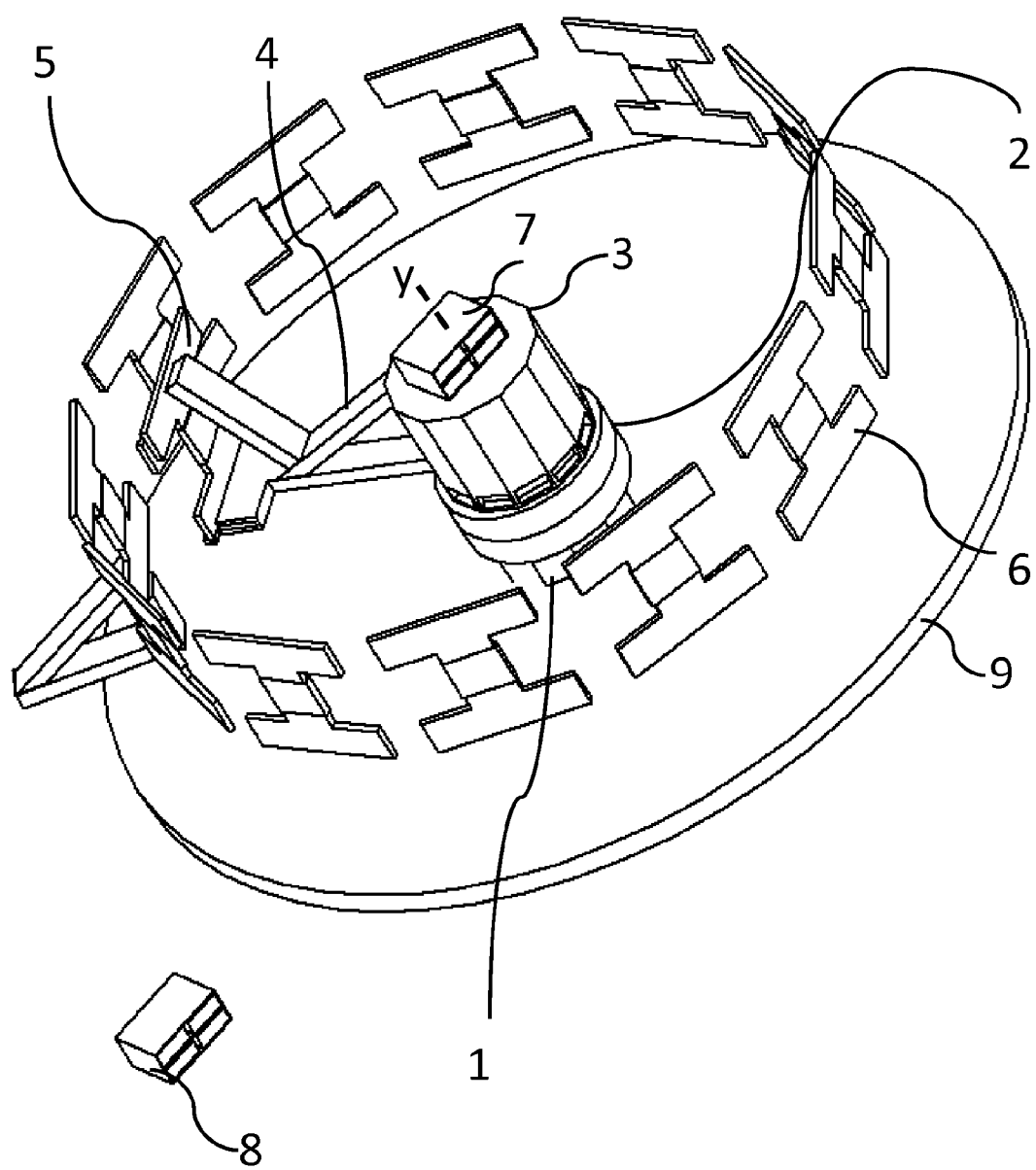
FIG. 3 illustrates an exemplary testing system.

Because the transmitters and/or receivers are likely to be thin, the entire receiver travels at the same velocity relative to the transmitter. For example, in the exemplary designs illustrated in FIGS. 1 and 2, the transmitter and receiver may or may not be completely parallel to each other. This can in some applications be desired because parallelism cannot be ensured in practical roadway wireless power transfer systems. However, if parallelism is desired, additional designs may be employed to ensure parallelism of the receiver and transmitters. For example, FIG. 3 illustrates such a design (FIG. 3 employs the same basic components as is illustrated in FIG. 1 and described above, except that the orientation of the plates 5 and 6 as illustrated in FIG. 1 are shown in FIG. 3 as being parallel with the y-axis, as opposed to being perpendicular as in FIGS. 1 and 2). An advantage of the embodiment exemplified in FIG. 3 is that for various pad sizes, arm length may not require adjustment. Thus, Ferris-wheel like configurations and treadmill like arrangements are also included herein.

The following examples are illustrative only and are not intended to limit the disclosure in any way.

EXAMPLES

The components and specifications of an exemplary test system are summarized in the following table:

| Example Specifications | |
|---|---|
| Radius of arm | 12-18 ft. |
| Adjustment of distance between pads | 12 inches to 20 inches |
| Rotating speed range | 0-150 rpm (0-75 mph) |
| Power level per pad | Up to tens of kilowatts |
| Pad size | Up to 4-5 feet square |
| Acceleration | 1.1 rad/s$^2$, 2.7 m/s$^2$ (8.9 ft/s$^2$) |
| Gear ratio | 1:12 |
| Electric Motor Size | 7.5 to 15 horsepower |

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:
1. A test system, comprising:
   a stationary plate;
   a rotating plate;
   a support arm connected to the rotating plate;
   a transmitter pad;
   a receiver pad, wherein one of
      the transmitter pad is coupled to the stationary plate and the receiver pad is coupled to the rotating plate; and
      the transmitter pad is coupled to the rotating plate and the receiver pad is coupled to the stationary plate,
   and wherein the transmitter pad transmits power wirelessly to the receiver pad when the transmitter pad is rotationally positioned close enough to the receiver pad to transfer power wirelessly from the transmitter pad to the receiver pad; and
   a driver that rotates the support arm and the rotating plate with respect to the stationary plate about an axis, wherein the driver rotates the rotating plate past the stationary plate at a speed that approximates of a vehicle on a driving surface.

2. The test system of claim 1, wherein the rotating plate and stationary plate are intermittently in proximity to simulate the conditions of in-motion wireless power transfer.

3. The test system of claim 1, wherein the rotating plate passes directly over the stationary plate when the driver rotates the rotating plate.

4. The test system of claim 3, wherein the distance between the stationary plate and rotating plate when they align is 6 to 20 inches.

5. The test system of claim 1, wherein the support arm that attaches the driver to the rotating plate is adjustable to adjust one or more of
   a vertical distance between the rotating plate and the stationary plate, the vertical distance measured in a direction of the axis;
   a horizontal distance between the rotating plate and the stationary plate, the horizontal distance measured in a direction perpendicular to the axis; and
   an angle between the rotating plate and the stationary plate.

6. The test system of claim 1, wherein the driver variably rotates the rotating plate in a range of from 0-150 rpm.

7. The test system of claim 5, wherein the support arm has an adjustable length.

8. The test system of claim 1, wherein the driver is powered by wireless power transfer.

9. The test system of claim 1, wherein the stationary plate has the receiver pad mounted thereto and the rotating plate has the transmitter pad mounted thereto.

10. The test system of claim 1, wherein the stationary plate has the transmitter pad mounted thereto and the rotating plate has the receiver pad mounted thereto.

11. The test system of claim 1, wherein the stationary plate and the rotating plate are mounted in a horizontal direction with a vertical distance separating the rotating plate and the stationary plate, wherein the vertical distance is in a direction along the axis and the horizontal direction is a direction perpendicular to the axis.

12. The test system of claim 1, wherein the stationary plate and the rotating plate are mounted in a vertical direction with a horizontal distance separating the rotating plate and the stationary plate, wherein the horizontal distance is in a direction perpendicular to the axis and the vertical direction is a direction along the axis.

13. The test system of claim 1, wherein the stationary plate comprises a plurality of stationary plates, each stationary plate is coupled to one of a receiver pad and a transmitter pad, wherein when the stationary plates are each coupled to a transmitter pad, the rotating plate is coupled to a receiver pad and wherein when the stationary plates are each coupled to a receiver pad the rotating plate is coupled to a transmitter pad.

14. The test system of claim 1, wherein the driver rotates the rotating plate past the stationary plate at a speed of between zero and 75 miles per hour.

15. A method for testing a moving wireless power transfer system, the method comprising:
   mounting one of a receiver pad and a transmitter pad to a stationary plate;
   mounting one of a receiver pad and a transmitter pad to a stationary plate and a rotating plate, wherein when a receiver pad is mounted to the stationary plate, a transmitter pad is mounted to the rotating plate and wherein when a transmitter pad is mounted to the stationary plate, a receiver pad is mounted to the rotating plate;
   connecting a support arm between the rotating plate and a driver;
   rotating, using the driver, the support arm and the rotating plate with respect to the stationary plate about an axis at a test speed, the test speed consistent with a speed a vehicle travels on a driving surface;
   providing power to the transmitter pad, the transmitter pad transmits power wirelessly to the receiver pad when the transmitter pad is in rotationally positioned close enough to the receiver pad to transfer power wirelessly from the transmitter pad to the receiver pad.

16. The method of claim 15, further comprising adjusting the speed of rotation to simulate various speed conditions.

17. The method of claim 15, further comprising adjusting one or more of a distance between the rotating plate and the stationary plate and an angle between the rotating plate and the stationary plate to simulate movement of a vehicle with respect to ground mounted transmitter pads.

18. A test system, comprising:
   a plurality of stationary plates;
   a rotating plate;
   a support arm connected to the rotating plate;
   a plurality transmitter pads, wherein each stationary plate is coupled to a transmitter pad;
   a receiver pad coupled to the rotating plate, wherein the transmitter pads transmit power wirelessly to the receiver pad when the receiver pad is rotationally positioned close enough to a transmitter pad to transfer power wirelessly from the transmitter pad to the receiver pad;
   a driver that rotates the support arm and the rotating plate with respect to the stationary plate about an axis;
   wireless power transfer electronics that sends power to the transmitter pad and receives power from the receiver pad;
   a controller that controls the driver to control speed of the rotating plate and support arm;
   monitoring hardware that monitors one or more of current, voltage, angular position, speed, acceleration, and temperature of one or more of the transmitter pad, the receiver pad, the wireless power transfer electronics and the driver.

\* \* \* \* \*